United States Patent [19]

Swartz

[11] 4,428,111
[45] Jan. 31, 1984

[54] MICROWAVE TRANSISTOR

[75] Inventor: Robert G. Swartz, Highlands, N.J.

[73] Assignee: Bell Telephone Laboratories, Incorporated, Murray Hill, N.J.

[21] Appl. No.: 327,790

[22] Filed: Dec. 7, 1981

[51] Int. Cl.³ .................. H01L 21/203; H01L 21/302
[52] U.S. Cl. ..................................... 29/576 E; 29/578; 29/580; 29/590; 29/591; 148/175; 156/647; 156/649; 156/662; 357/34; 357/55; 357/56; 357/89
[58] Field of Search .................... 29/576 E, 578, 580, 29/590, 591; 148/175, 33.5; 156/647, 649, 662; 357/34, 55, 56, 89

[56] References Cited

U.S. PATENT DOCUMENTS

| | | | |
|---|---|---|---|
| 3,394,289 | 7/1968 | Lindmayer | 148/175 X |
| 3,488,235 | 1/1970 | Walczak et al. | 148/175 X |
| 3,576,683 | 4/1971 | Matsubara | 29/591 X |
| 3,648,123 | 3/1972 | Ernick et al. | 357/56 X |
| 4,226,648 | 10/1980 | Goodwin et al. | 29/576 E |

OTHER PUBLICATIONS

Swartz et al., "An Uncompensated Silicon Bipolar Junction Transistor . . . ." IEEE Electron Device Letters, vol. EDL-2, No. 11, Nov. 1981, pp. 293-295.
Ota, Y., "Silicon Molecular Beam Epitaxy with . . . Doping" J. Appl. Phys., vol. 51 (2), Feb. 1980, pp. 1102-1110.
Nakamura et al., "Self-Aligned Transistor with Sidewall Base Electrode" International Solid-State Circuit Conf. (IEEE), Feb. 1980, pp. 214-215.
Sze, S. M., *Physics of Semiconductor Devices* (Textbook), John Wiley and Sons, N.Y., 1961, pp. 279-289.
Boss et al., "Epitaxial Transistor with exposed Base Contact" I.B.M. Tech. Discl. Bull., vol. 10, No. 2, Jul. 1967, p. 166.

Primary Examiner—W. G. Saba
Attorney, Agent, or Firm—Daniel D. Dubosky; Gregory C. Ranieri

[57] ABSTRACT

A process for fabricating a high speed bipolar transistor is described wherein the collector, base and emitter layers are first grown using molecular beam epitaxy (MBE). A mesa etch is performed to isolate a base-emitter region, and a contact layer is grown using MBE over this isolated region to make contact with the thin base layer. The contact layer is selectively etched to expose the emitter layer, and metal is deposited to fabricate emitter, base and collector contacts.

3 Claims, 6 Drawing Figures

MICROWAVE TRANSISTOR

BACKGROUND OF THE INVENTION

This invention relates to a microwave transistor and, more particularly, to a bipolar transistor having an ultra thin base capable of operating at speeds in the gigahertz range.

Present techniques of fabricating bipolar transistors, including ion implant doping, are limited in that they cannot reliably produce base layers with thicknesses less than 1000 Å. Accordingly, these transistors are limited in their operation to speeds less than 10 GHz. A bipolar transistor having a base thickness of less than 1000 Å would be a valuable device for use in high speed optical communications systems where the laser may be driven with a pulse rate in excess of 10 GHz.

SUMMARY OF THE INVENTION

A high speed bipolar transistor having a base region with a thickness less than 1000 Å is achievable in accordance with the present invention wherein the molecular beam epitaxial growth process is used to grow three levels of variously doped single crystal layers on a single crystal silicon substrate. These three levels correspond to the collector, base, and emitter regions of the transistors to be fabricated. Since MBE is a low temperature growth process, the base layer can be made arbitrarily thin, less than 1000 Å. After growing the emitter, base and collector layers, the wafer is then mesa etched in order to isolate regions of the emitter and base layers. The wafer is then reinserted into the MBE apparatus in order to grow a contact layer having the same conductivity type (i.e., p or n) as the base layer over the entire wafer. The conductivity of this contact layer, however, is purposely caused to be less than the high conductivity of the base region. A second mesa etch is then performed to expose the emitter layer and isolate the base regions of adjacent transistors. A silicon dioxide layer is then deposited over the entire top surface of the layer and selectively etched to expose the emitter layer and a portion of the contact layer which is in contact with the base region. Finally, metallic contacts are deposited on the exposed emitter layer, the exposed contact layer, and bottom surface of the wafer in order to fabricate the emitter, base and collector contacts, respectively.

BRIEF DESCRIPTION OF THE DRAWING

The invention will be more readily understood after reading the following detailed description in conjunction with the drawing wherein.

DETAILED DESCRIPTION

Figure 1:
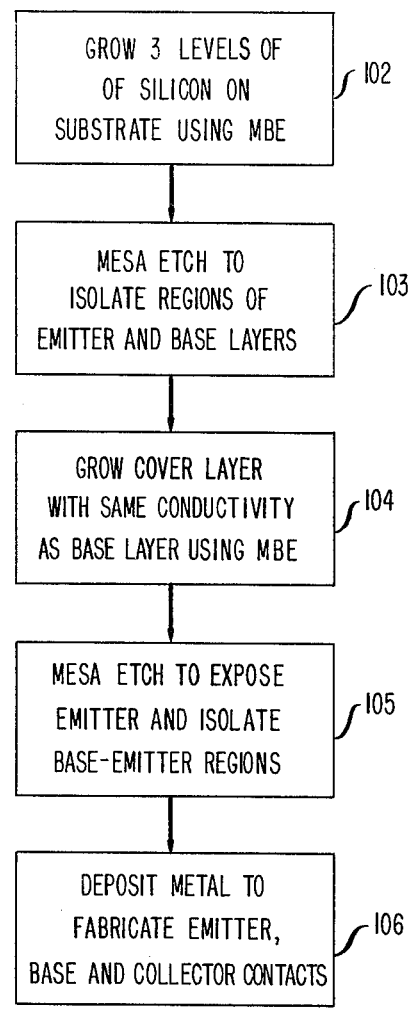
FIG. 1 is a flow diagram setting forth the major steps in a process practiced in accordance with the present invention.
Figure 2:
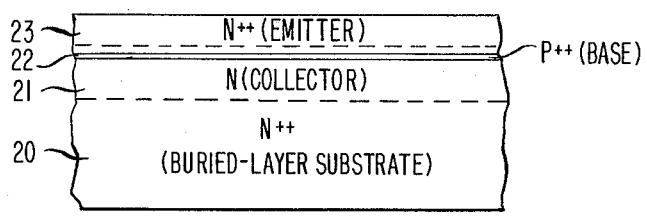
FIGS. 2-6 are cross-sectional illustrations of a single device on the wafer being processed after each one of the major steps set forth in the flow diagram of FIG. 1.

Major steps in the present invention are illustrated in the flow diagram shown in FIG. 1. This process is normally applied to an entire wafer of semiconductor material and the wafer is subsequently separated into individual transistors which may then be mounted. A cross section of the wafer corresponding to a single device is shown in FIGS. 2-6 for each of the major steps indicated in FIG. 1. The structure of the wafer following any one of the process steps is illustrated in the figure whose identifying number corresponds to the units digit of the process step. For example, FIG. 2 shows the wafer cross section following step 102.

The device fabricated using the present invention is a silicon NPN bipolar junction transistor. PNP transistors may be fabricated in an identical manner using complementary dopants.

Initially, a starting silicon substrate doped with arsenic or antimony to a resistivity of 0.008 ohm-cm is selected. The surface of the wafer is oriented parallel to a <100> crystalline plane. The wafer is polished on one face. It is then cleaned and its surface prepared by the following sequence of steps:

1. Scrub with water and liquid soap.
2. Rinse with deionized water.
3. Boil the substrate for 10 minutes in trichloroethylene.
4. Boil for an additional 10 minutes in acetone.
5. Rinse using methanol.
6. Rinse using deionized water.
7. Heat the substrate for 10 minutes in a solution of 1:1, $H_2SO_4:H_2O_2$.
8. Rinse using deionized water.
9. Dip the substrate for 1 minute in 50:1, $H_2O:HF$.
10. Rinse again using deionized water.
11. Boil the substrate for 10 minutes in 1:1:1, $NH_4OH:H_2O_2:H_2O$.

The last step grows a thin (30 Å–50 Å) layer of $SiO_2$ on the wafer surface which serves to protect it in subsequent processing.

The wafer is then mounted in a stainless steel bell jar which is evacuated to a pressure of mid-$10^{-9}$ torr. The jar is part of a silicon molecular beam epitaxy (MBE) system which has been described in the literature. See the article by Y. Ota entitled "Silicon Molecular Beam Epitaxy with Simultaneous Ion Implant Doping," *J. Applied Physics*, Vol. 51, No. 2, February, 1980, pp. 1102-1110. The wafer is resistively heated by passing an electrical current through it, and the wafer temperature is measured by monitoring its optical emission with a pyrometer. Initially, the wafer is heated from room temperature to 1100 degrees C., and then cooled to 800 degrees C. over a 10 minute interval. The protective $SiO_2$ layer is desorbed by this process, thus exposing a clean silicon surface. Alternatively, this layer may be removed by 1 keV argon sputtering at room temperature, followed by a 10 minute anneal at 900 degrees C.

Epitaxial growth is initiated by the electron beam evaporation of silicon from a high purity source. This silicon deposits as single crystal epitaxy on the silicon substrate. Simultaneously, a low energy ion beam of dopant atoms, focussed on the substrate, dopes the epitaxial layer as it grows. The dopant atoms may be arsenic or boron as described in the copending patent application entitled "Rapid Alteration of Ion Implant Dopant Species to Create Regions of Opposite Conductivity," Ser. No. 275,418, filed June 19, 1981. The former is an N-type, and the latter a P-type dopant in silicon. As stated in the above-identified copending application, both dopants can be present in the ion gun of the MBE apparatus described in the above-identified article by Ota, and a particular dopant is chosen at any given time by adjustment of the $\overline{E} \times \overline{B}$ mass filter at the output of the ion gun.

Doping concentration is varied by adjusting the ratio of incident dopant atoms to incident silicon atoms. This is done by electrostatically scanning the dopant ion beam and by varying the source silicon evaporation rate. The ion beam energy is typically 600 eV.

Using the above-described process steps, the first major step of the inventive process designated as step 102 in the flow chart of FIG. 1 is completed, and a three layer structure of epitaxy shown in FIG. 2 is grown at 800 degrees C., doped N-P-N. FIG. 2, as in all figures. to follow, illustrates only a portion of the entire wafer that corresponds to a single device. It should be apparent to those skilled in the art that a semiconductor wafer can be processed to simultaneously produce a large number of devices.

The first layer 21 on substrate 20 in FIG. 2 is arsenic doped and will later become the collector. The second layer 22, boron doped, will form the base. The final layer 23, doped with arsenic, will constitute the emitter.

Listed below are the thickness and doping parameters for a 0.3 $\mu$m base process which should yield a device with an $f_T$ of approximately 2 GHz. This is an initial attempt at verifying the technology. Higher frequency devices are possible, and the constraints on such a device are explored at the conclusion of this section.

| Layer | Doping | Dopant | Thickness |
| --- | --- | --- | --- |
| Substrate 20 | $8 \times 10^{18}/cm^3$ | As | ~500 $\mu$m |
| Collector 21 | $3 \times 10^{15}/cm^3$ | As | 2.0 $\mu$m |
| Base 22 | $6 \times 10^{16}/cm^3$ | B | .3 $\mu$m |
| Emitter 23 (1) | $3 \times 10^{17}/cm^3$ | As | .1 $\mu$m |
| (2) | $2 \times 10^{18}/cm^3$ | As | .9 $\mu$m |

A two-layer emitter is used. The lightly doped first layer reduces the emitter-base capacitance and limits the extent of the penetration of the emitter-base depletion layer into the base. The second layer acts to increase the forward current gain, $\beta_F$, of the device and promotes ohmic contact with subsequently deposited metal layers.

Figure 3:
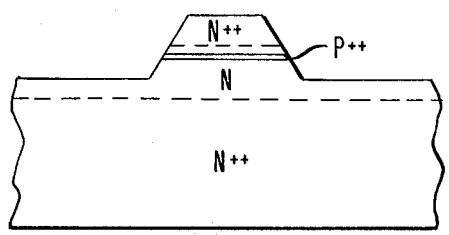

Following this growth process step 102, the substrate is removed from the bell jar and an etch performed as set forth in step 103 of FIG. 1 to define mesas with sloped walls as illustrated in FIG. 3. The etch used may be any one of several chemicals which preferentially attack silicon along <100> or <110> crystalline planes, but which etch <111> planes very slowly. The preferred etch is tetramethylammonium hydroxide, ethylene glycol, plus other compounds known to Mr. Evan Thomas at the Allied Chemical Research Laboratories in Buffalo, N.Y. This preferred etch was obtained from Mr. Thomas, is available to all who request it for experimental purposes, but is not yet available as a marketable product from Allied Chemical. If any commercial use is established for this etch, Allied Chemical marketing department has indicated that the etch would then be offered as one of their marketed products. Used undiluted, the preferred etch from Mr. Thomas has an etch rate which is very slow (200-400 Å/sec), and the low etch temperature, 60 degrees C., of the etch makes this an easily controlled etch.

An alternative etch is a solution of ethylene diamine and pyrocatechol in $H_2O$. This is a faster etch than the preferred etch and, additionally, is considerably more hazardous to use.

The mesa formation procedure is as follows:
1. Deposit 0.6 $\mu$m masking $SiO_2$ on the wafer by reaction of silane ($SiH_4$) with oxygen at 450 degrees C.
2. Spin on photoresist and pattern it using standard photolithorgraphic methods.
3. Etch oxide with a buffered HF acid solution to expose silicon except where mesas are to be located.
4. Etch mesas with either:
    a. The Allied Chemical preferred etch, undiluted, at 60 degrees C. in atmosphere. Stirring is required.
    b. The alternative etch consisting of a solution of (in proportion):
        Ethylene diamine: 17 ml
        Pyrocatechol: 3 gm
        $H_2O$: 8 ml
        heated to 110 degrees C. in nitrogen with $N_2$ bubbling. This is a faster etch (1 $\mu$m/min), and considerably more hazardous to use.
5. Following the etch, rinse samples thoroughly in deionized water and perform an HF strip to remove the masking oxide.

The etch depth must be sufficient to expose the base layer as shown in FIG. 3. For the 0.3 $\mu$m base device described here, a nominal depth is 1.5 $\mu$m.

The wafer is then reloaded into the MBE system following the same cleaning and preparation procedure described previously. An in-situ argon sputter clean is preferred at this time because of the lower temperatures involved.

Figure 4:
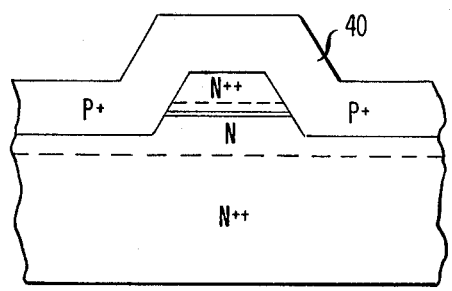

In accordance with major step 104 in the process illustrated in FIG. 1, a new contact layer 40 of silicon is grown at 800 degrees C. on the wafer surface (FIG. 3), doped with boron to a density of $5 \times 10^{16}/cm^3$, with a nominal thickness of 1 $\mu$m as indicated in FIG. 4. This layer 40, which covers the entire wafer surface and is doped p-type, serves to contact the exposed base region. The sloped walls of the mesa insure that vertically incident silicon atoms are able to deposit epitaxially on the mesa sidewall.

Figure 5:
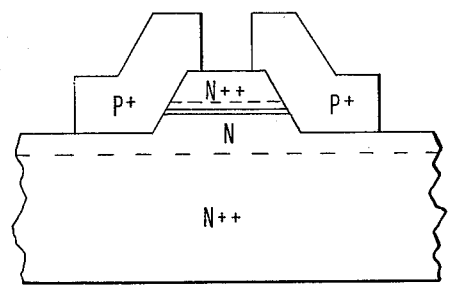
Figure 6:
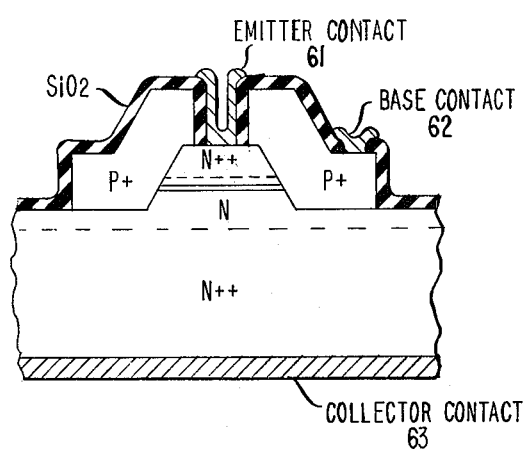

The wafer is then removed from the MBE system. A masking oxide is deposited as before, and a second etch, designated as major step 105 in the process illustrated in FIG. 1, is performed to a depth of 1.2 $\mu$m. As indicated in FIG. 5, this etch exposes the emitter surface and also isolates the base regions of adjacent devices. Another oxide patterning follows to expose contact areas. Aluminum is then deposited, patterned, and sintered at 450 degrees C. to fabricate emitter, base and collector contacts in accordance with major step 106 of the process illustrated in FIG. 1. The resulting device is illustrated in FIG. 6 wherein the positions of the emitter contact 61, base contact 62, and collector contact 63 are shown. Conventional techniques may be used to dice the wafer and mount the individual transistors.

MBE silicon growth rates are typically 3-16 Å/sec so that the entire device is fabricated in less than 2 hours of actual growth time. Low temperature MBE growth throughout the process is a necessity to prevent diffusion in the base region. Neither of the silicon etches used is critical with respect to depth, regardless of base width.

As reported by S. M. Sze in his text "Physics of Semiconductor Devices," John Wiley and Sons, New York, 1969, pages 279-289, the principal sources of time delay in a bipolar transistor are:
1. emitter depletion-layer charging time,
2. base layer charging time,
3. collector depletion-layer transit time, and
4. collector charging time.

The MBE process described here directly addresses item (2) by minimizing the base-width. Items (1) and (4) are conventionally reduced by using small geometries and a heavily-doped substrate.

The design constraints for a high speed bipolar transistor are as follows:

1. The base region must be narrow, but sufficiently highly doped to prevent collector-emitter punch through.
2. The base contact layer should be more lightly doped than the base region to minimize emitter-base capacitance.
3. The *total* emitter doping (integrated across the emitter) must be much greater than the total base doping in order to maximize the forward current gain $\beta_F$.
4. The lightly-doped collector region must be thick enough to prevent avalanche breakdown of the collector-base depletion layer, but it must not be too thick or collector charging time is unnecessarily increased.
5. The final device geometry must be small and properly packaged to reduce parasitic capacitance.

Using the methods suggested here, base widths of less than 500 Å should be easily obtained.

The process described hereinabove is an illustrative embodiment of the present invention. Numerous departures can be made by those skilled in the art without departing from the spirit and scope of the present invention. For example, the step used to create a mesa with isolated regions of emitter and base layers could be replaced with a step using reactive ion etching rather than the chemical process described herein.

What is claimed is:

1. A process for fabricating a high speed bipolar transistor comprising the steps of
    growing collector, base and emitter layers on a semiconductor substrate using molecular beam epitaxy, the substrate having a conductivity similar to the collector layer,
    etching the grown layers to isolate regions of emitter and base layers,
    growing a contact layer over the etched surface with the same conductivity as said base layer using molecular beam epitaxy,
    selectively etching said contact layer to expose the emitter-base layer and isolate emitter base regions, and
    depositing metal on the exposed emitter layer, a portion of said contact layer, and on said substrate to fabricate emitter, base and collector contacts, respectively.

2. A process for fabricating a bipolar transistor comprising the steps of
    growing at least three layers of alternate conductivity on a semiconductor substrate using molecular beam epitaxy, the semiconductor substrate having a conductivity similar to the conductivity of an immediately adjacent grown layer of the at least three layers,
    etching the grown layers substantially to the depth of the first grown layer to isolate regions of the top two layers,
    growing a contact layer over the etched surface with the same conductivity as the center one of said three layers using molecular beam epitaxy,
    selectively etching said contact layer to expose the topmost one of said three layers and to isolate regions of said contact layer, and
    depositing metal on the exposed top layer of said three grown layers, on a portion of said contact layer, and on a portion of said substrate to fabricate emitter, base and collector contacts.

3. A process for fabricating a bipolar transistor on a silicon substrate comprising the steps of
    growing three layers of alternate conductivity on said silicon substrate using molecular beam epitaxy, the silicon substrate having a conductivity similar to the conductivity of an immediately adjacent grown layer of the three layers,
    etching the grown layers at least to the depth of the first grown layer to isolate regions of the top two grown layers,
    growing a contact layer over the etched surface having the same conductivity as the middle one of said three grown layers using molecular beam epitaxy,
    selectively etching the contact layer to expose the top grown layer and to separate the contact layer into isolated regions each one of which has a single isolated region of the top two grown layers, and
    depositing metal on the exposed top layer, on a portion of said contact layer, and on a portion of said silicon substrate to fabricate emitter, base and collector contacts.

* * * * *

UNITED STATES PATENT AND TRADEMARK OFFICE
CERTIFICATE OF CORRECTION

PATENT NO. : 4,428,111

DATED : January 31, 1984

INVENTOR(S) : Robert G. Swartz

It is certified that error appears in the above-identified patent and that said Letters Patent is hereby corrected as shown below:

Column 6, line 2, "emitter-base layer" should read --emitter layer--, and "emitter base regions" should read --emitter-base regions--.

Signed and Sealed this

Twenty-fourth Day of April 1984

[SEAL]

Attest:

GERALD J. MOSSINGHOFF

Attesting Officer     Commissioner of Patents and Trademarks